US011977237B2

(12) United States Patent
Xia

(10) Patent No.: US 11,977,237 B2
(45) Date of Patent: May 7, 2024

(54) VR SYSTEM AND POSITIONING AND TRACKING METHOD OF VR SYSTEM

(71) Applicant: QINGDAO PICO TECHNOLOGY CO., LTD., Shandong (CN)

(72) Inventor: Jiu Xia, Shandong (CN)

(73) Assignee: QINGDAO PICO TECHNOLOGY CO., LTD (CN)

( * ) Notice: Subject to any disclaimer, the term of this patent is extended or adjusted under 35 U.S.C. 154(b) by 0 days.

(21) Appl. No.: 17/819,607

(22) Filed: Aug. 12, 2022

(65) Prior Publication Data
US 2022/0382063 A1   Dec. 1, 2022

Related U.S. Application Data

(63) Continuation of application No. PCT/CN2021/120784, filed on Sep. 26, 2021.

(51) Int. Cl.
*G02B 27/01* (2006.01)
*G01R 33/07* (2006.01)

(52) U.S. Cl.
CPC ....... *G02B 27/0176* (2013.01); *G01R 33/072* (2013.01)

(58) Field of Classification Search
CPC .... G02B 27/0176; G02B 27/017; G02B 7/00; G02B 7/003; G02B 7/004; G02B 7/005;
(Continued)

(56) References Cited

U.S. PATENT DOCUMENTS

| 2015/0109576 A1 | 4/2015 | Krasnow et al. |
| 2017/0090568 A1 | 3/2017 | Chen et al. |

(Continued)

FOREIGN PATENT DOCUMENTS

| CN | 104849864 A | 8/2015 |
| CN | 105425397 A | 3/2016 |

(Continued)

OTHER PUBLICATIONS

"Polarity" Polarity—Sparkfun Learn, http://learn.sparkfun.com/tutorials/polarity/all (Year: 2019).*
(Continued)

*Primary Examiner* — James C. Jones
*Assistant Examiner* — Henry Duong

(57) ABSTRACT

A position detection device of a VR device is provided. A gear rack and a gear are provided between the left lens barrel and the right lens barrel, and the gear rack is made to be occluded with the gear. A magnet is fixed at a preset position, and a magnetic induction intensity of the magnet set based on a relative position relationship between the left lens barrel and the right lens barrel in the VR device is detected by means of a Hall sensor. A distance between the Hall sensor and the magnet is calculated according to the magnetic induction intensity. Relative movement data between the gear rack and the gear is determined based on the distance between the Hall sensor and the magnet, and then a distance between the left lens barrel and the right lens barrel is determined according to the relative movement data, and the distance between the left lens barrel and the right lens barrel is determined as a pupil distance between both eyes of a user, so that targeted image can be output based on the pupil distance.

11 Claims, 7 Drawing Sheets

(58) Field of Classification Search
CPC ........ G02B 7/02; G01R 33/072; G01R 33/07;
G01D 5/145; H04N 13/332; G03B 17/04;
G03B 30/00
USPC ......................................................... 359/694
See application file for complete search history.

(56) References Cited

U.S. PATENT DOCUMENTS

2021/0132397 A1* 5/2021 Stellman ............ G02B 27/0176
2021/0405396 A1* 12/2021 Ma ........................... G02C 9/02
2022/0373799 A1 11/2022 Wang

FOREIGN PATENT DOCUMENTS

| CN | 208888485 U | 5/2019 |
| CN | 109874002 A | 6/2019 |
| CN | 209858860 U | 12/2019 |
| CN | 112068760 A | 12/2020 |
| CN | 112630972 A | 4/2021 |
| CN | 212905721 U | 4/2021 |

OTHER PUBLICATIONS

Search Report dated Feb. 10, 2022 in PCT/CN2021/120784, English translation (5 pages).
Written Opinion dated Feb. 7, 2022 in PCT/CN2021/120784, English translation (5 pages).
First Office Action dated Feb. 18, 2022 in corresponding CN Application No. 202110550630.6, English translation (45 pages).

* cited by examiner

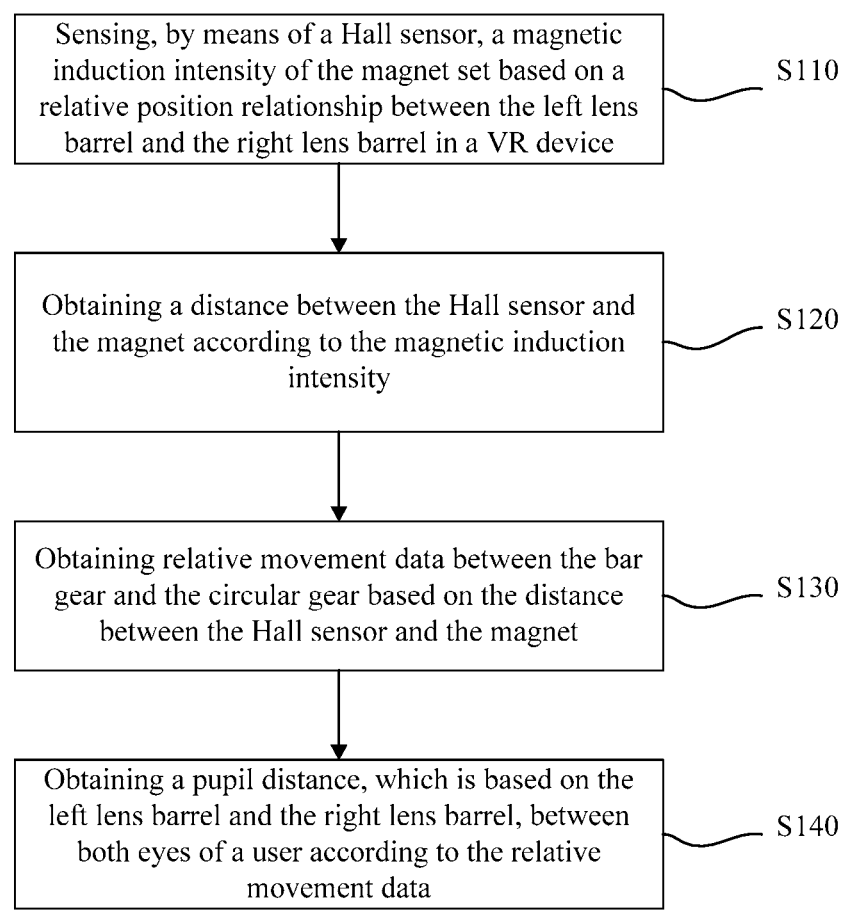

VR SYSTEM AND POSITIONING AND TRACKING METHOD OF VR SYSTEM

CROSS REFERENCE

This application is a continuation of the PCT International Application No. PCT/CN2021/120784 filed on Sep. 26, 2021, which claims priority to Chinese Application No. 202110550630.6 filed with China National Intellectual Property Administration on May 17, 2021, the entirety of which is herein incorporated by reference.

TECHNICAL FIELD

The present disclosure relates to the field of virtual reality technology, and in particular, to a position detection device and method of a Virtual Reality (VR) device.

BACKGROUND

Due to the advancement of technology and the diversification of market demand, virtual reality systems are becoming increasingly common in many applications such as computer games, health and safety, industry and education and training. For example, mixed virtual reality systems are being integrated into mobile communication devices, game consoles, personal computers, movie theaters, theme parks, university laboratories, student classrooms, exercise and fitness rooms in hospitals, and other parts of life.

A VR device is a computer simulation device that can create and provide the experience of virtual worlds. The VR device generates a simulated environment by running computer programs, and provides a multi-source information fusion, interactive 3D dynamic visualization and entity behavior simulation, which allows users to immerse themselves in the virtual environment. With the development of VR technologies, there are higher requirements for the comfort of VR. As different people in the user population may have different pupil distances, and the difference in pupil distances will lead to different requirements for the positions of the lens barrels of a VR device. Therefore, a VR device needs to detect different pupil distances of users to automatically adjust the image output, thereby achieving better visual effects.

Therefore, there is an urgent need for a position detection device and method of a VR device that can automatically detect the pupil distance of the user.

SUMMARY

Embodiments of the present disclosure provide a position detection device and method of a VR device, which can meet the demand for detecting different pupil distances of users to automatically adjust the image output so as to achieve better visual effects, in consideration of the fact that different people in the user population may have different pupil distances, and the difference in pupil distances will lead to different requirements for the positions of the lens barrels of a VR device.

The embodiments of the present disclosure provide a position detection device of a VR device. The position detection device comprises a left lens barrel and a right lens barrel.

A gear rack and a gear are provided between the left lens barrel and the right lens barrel, wherein the gear rack is occluded with the gear.

A magnet is fixed at a preset position which is determined based on a relative position relationship between the gear rack and the gear.

A Hall sensor is provided next to the magnet. The Hall sensor is configured to detect a magnetic induction intensity of the magnet.

The Hall sensor is connected to a computing unit. The computing unit is configured to calculate a distance between the Hall sensor and the magnet according to the magnetic induction intensity, and determine a distance between the left lens barrel and the right lens barrel according to the distance between the Hall sensor and the magnet.

In at least one exemplary embodiment, the position detection device further comprises a long sliding bar, a first sliding bar and a second sliding bar.

The long sliding bar comprises a left sliding segment and a right sliding segment.

Upper parts of the left lens barrel and the right lens barrel are fixed at the left sliding segment and the right sliding segment, respectively.

A bottom part of the left lens barrel is connected to the first sliding bar.

A bottom part of the right lens barrel is connected to the second sliding bar.

In at least one exemplary embodiment, the gear rack comprises an upper gear rack and a lower gear rack.

The upper gear rack is fixed to the left sliding segment or the right sliding segment.

The lower gear rack is fixed to a lens barrel holder in an opposite direction to the upper gear rack.

In at least one exemplary embodiment, the lens barrel holder comprises a left lens barrel holder and a right lens barrel holder.

The left lens barrel holder is configured to support the left lens barrel. The right lens barrel holder is configured to support the right lens barrel.

In at least one exemplary embodiment, the preset position is a position on the lens barrel holder.

In at least one exemplary embodiment, a notch mark is provided at one end of the magnet.

In at least one exemplary embodiment, when the left lens barrel is closest to the right lens barrel, a center of the magnet is aligned with a center of the Hall sensor.

In at least one exemplary embodiment, the preset position is on the gear.

The Hall sensor is set directly above the gear.

In at least one exemplary embodiment, the position detection device further comprises an adapter unit, and a rendering unit connected to the adapter unit.

The adapter unit is configured to determine the distance between the left lens barrel and the right lens barrel according to the relative movement data, and determine the distance between the left lens barrel and the right lens barrel as a pupil distance between both eyes of a user.

The rendering unit is configured to adjust and render image data output from the VR device according to the pupil distance.

The embodiments of the present disclosure also provide a position detection method of a VR device, wherein the method is performed by a position detection device of a VR device as previously described. The method comprises the following operations.

A magnetic induction intensity of the magnet is detected by means of a Hall sensor.

A distance between the Hall sensor and the magnet is calculated according to the magnetic induction intensity.

Relative movement data between the gear rack and the gear is determined based on the distance between the Hall sensor and the magnet.

A distance between the left lens barrel and the right lens barrel is determined according to the relative movement data, and the distance between the left lens barrel and the right lens barrel is determined as a pupil distance between both eyes of a user.

According to the position detection device and method of a VR device provided in the embodiments of the present disclosure, a gear rack and a gear are provided between the left lens barrel and the right lens barrel, and the gear rack is made to be occluded with the gear; a magnet is fixed at a preset position which is determined based on a relative position relationship between the gear rack and the gear; a Hall sensor is provided next to the magnet, and a distance between the Hall sensor and the magnet is calculated according to the magnetic induction intensity; relative movement data between the gear rack and the gear is determined according to the distance between the Hall sensor and the magnet, and then a distance between the left lens barrel and the right lens barrel is determined according to the relative movement data, thereby determining the pupil distance of the user. In this way, targeted image can be output based on the pupil distance to improve the visual effects and enable the user to have a better immersion experience.

BRIEF DESCRIPTION OF THE DRAWINGS

FIG. 7 is a schematic flowchart of the position detection method of a VR device according to the embodiments of the present disclosure.

The description of reference signs: 1. left lens barrel, 2. right lens barrel, 3. gear rack, 31. upper gear rack, 32. lower gear rack, 4. gear, 5. magnet, 6. Hall sensor, 7. long sliding bar, 71. left sliding segment, 72. right sliding segment, 8. first sliding bar, 9. second sliding bar, 10. left lens barrel holder, 11. right lens barrel holder, 12. tab, 13. spring.

DETAILED DESCRIPTION OF THE EMBODIMENTS

Today, different people in the user population may have different pupil distances, and the difference in pupil distance will lead to different requirements for the positions of the lens barrels of a VR device, so a VR device needs to detect different pupil distances of users to automatically adjust the image output so as to achieve better visual effects.

The embodiments of the present disclosure provide a position detection device and method of a VR device which can solve the above problems, the details of which is described in subsequent embodiments with reference to drawings.

Figure 1:
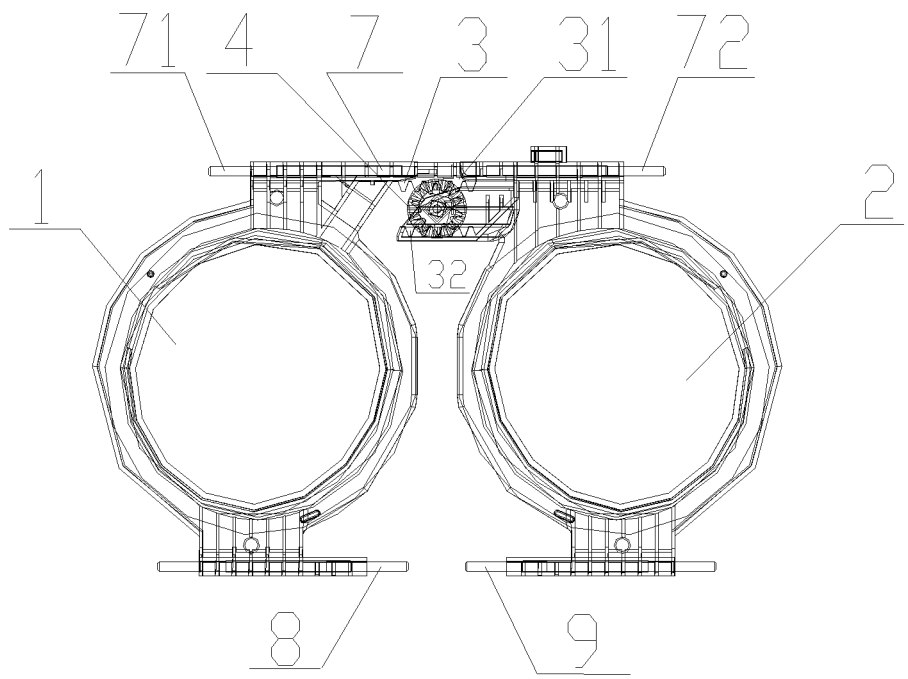
FIG. 1 is a schematic structural diagram of the cross-section of the position detection device of a VR device according to the embodiments of the present disclosure.
Figure 2:
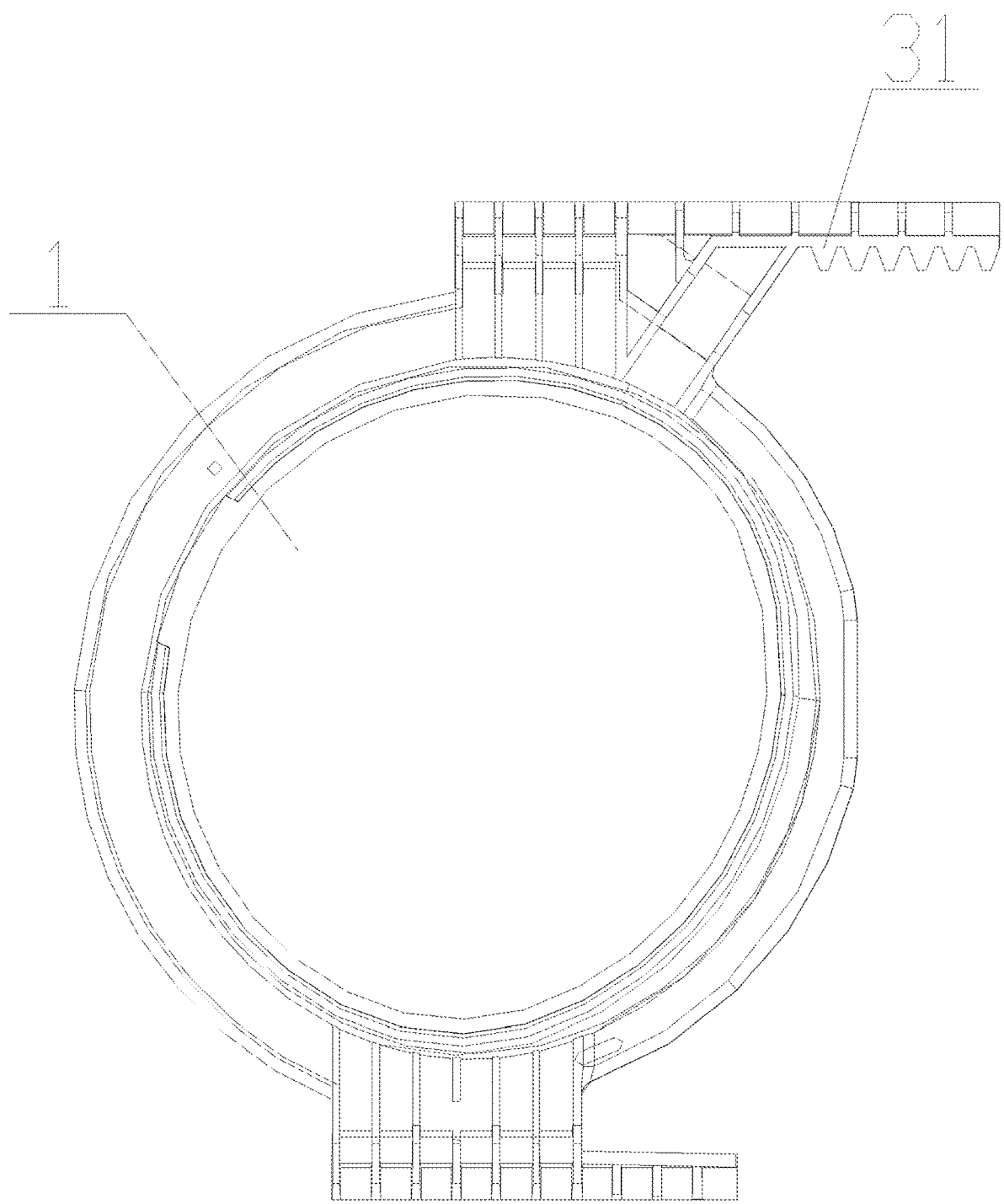
FIG. 2 is a front view of the left lens barrel in the position detection device of a VR device according to the embodiments of the present disclosure.
Figure 3:
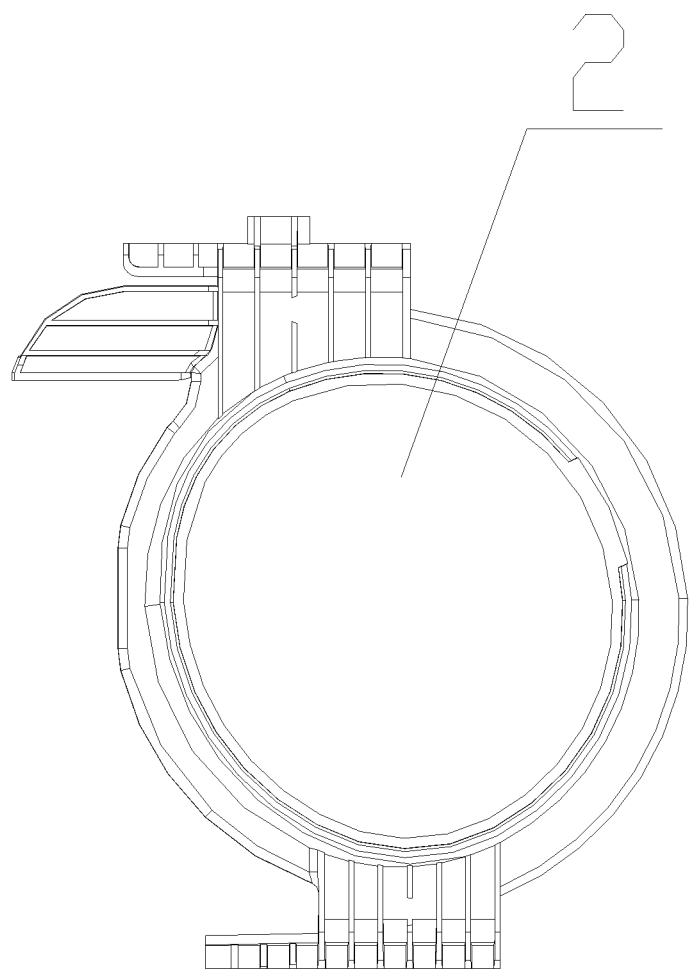
FIG. 3 is a front view of the right lens barrel in the position detection device of a VR device according to the embodiments of the present disclosure.
Figure 4:
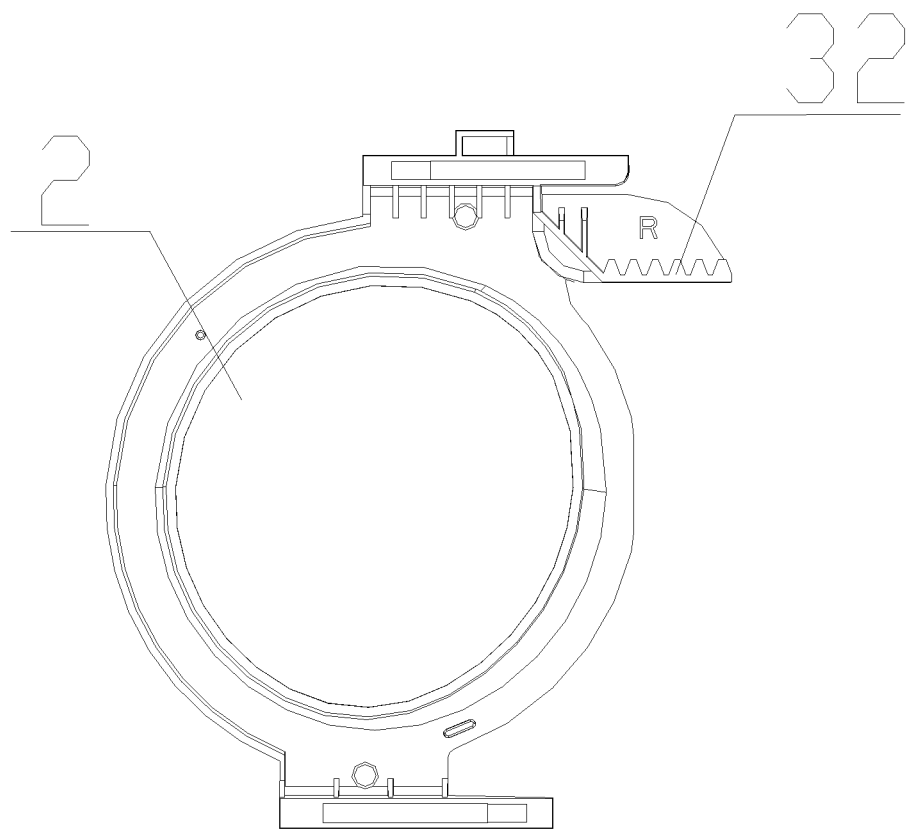
FIG. 4 is a rear view of the right lens barrel in the position detection device of a VR device according to the embodiments of the present disclosure.
Figure 5:
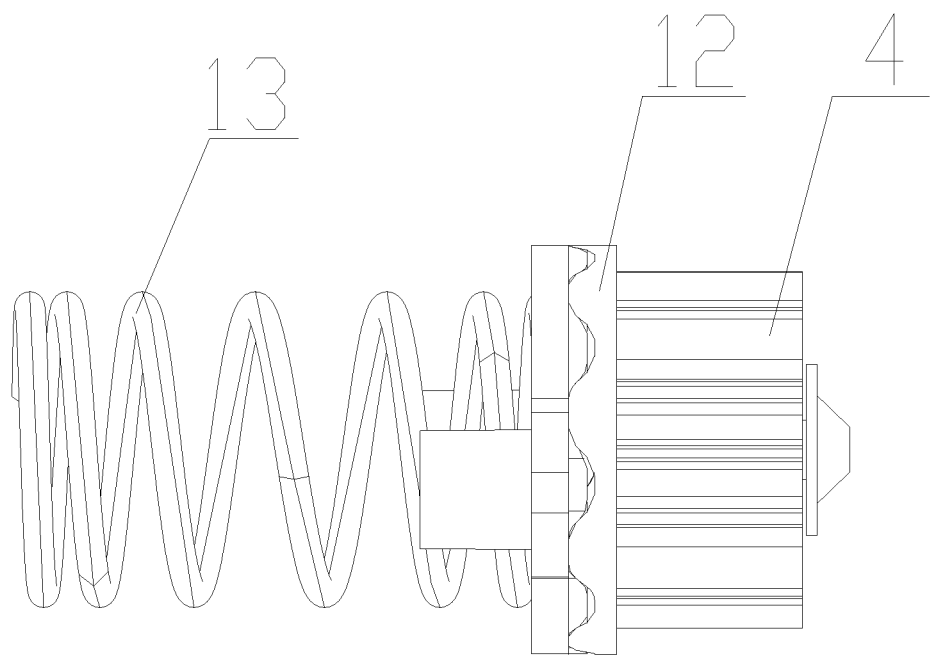
FIG. 5 is a schematic diagram of the mounting position of the gear in the position detection device of a VR device according to the embodiments of the present disclosure.
Figure 6:
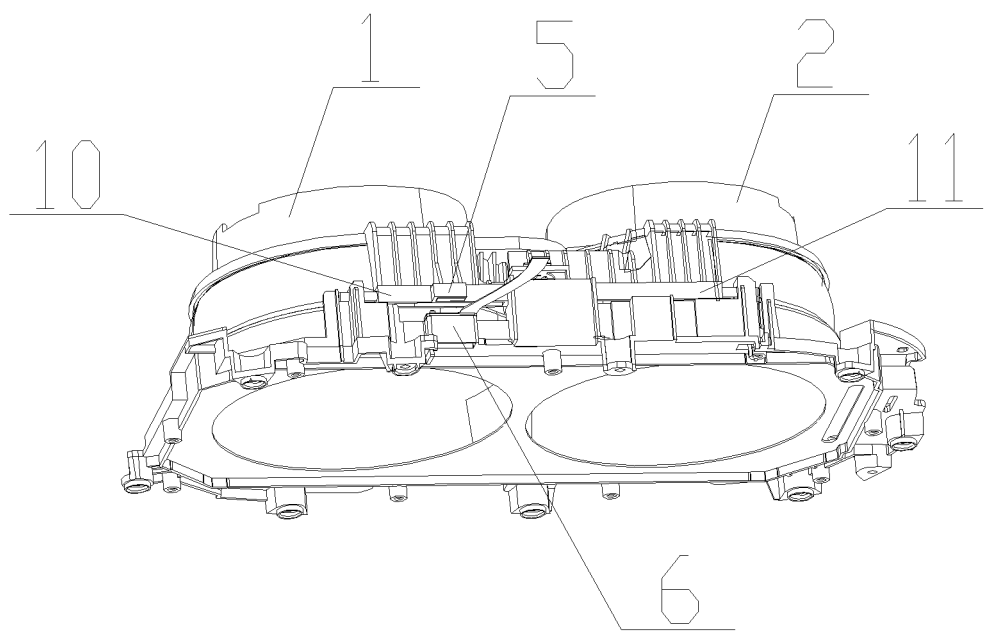
FIG. 6 is an overall schematic diagram of the position detection device of a VR device according to the embodiments of the present disclosure.

To illustrate the position detection device and method of a VR device provided in the embodiments of the present disclosure, FIG. 1 provides an exemplary illustration of the position detection device of a VR device according to the embodiments of the present disclosure. FIG. 7 provides an exemplary illustration of the position detection method of a VR device according to the embodiments of the present disclosure.

The description of the following exemplary embodiments is in fact merely illustrative and is in no way intended to serve as any limitation on the present disclosure and the application or use of the present disclosure. Techniques and apparatus known to those having ordinary skill in the relevant field may not be discussed in detail, but where appropriate, the techniques and apparatus should be considered as part of the description.

As shown in FIGS. 1, 2, 3, 4 and 5, the position detection device of a VR device according to the embodiments of the present disclosure comprises a left lens barrel 1 and a right lens barrel 2. A gear rack 3 and a gear 4 are provided between the left lens barrel 1 and the right lens barrel 2. The gear rack 3 is occluded with the gear 4. The specifications and position relationship of the gear rack 3 and the gear 4 are not specifically limited. In the embodiments, a gear rack 3 with a pitch of 2.512 mm, a total of 6 teeth, and a total length of 12.56 mm is provided in the upper part of the left lens barrel 1 and in the lower part of the right lens barrel 2, respectively. The pitch of the gear 4 is 36°, i.e., the gear rack 3 moves 2.512 mm for every 36° rotation of the gear 4 based on the gear relationship. Moreover, in the embodiments, a tab 12 with an interval of 40° is provided on the back side of the gear 4. The tab 12 with an interval of 40° is used as the base of the gear 4, and there is a spring 13 attached to the back side of the tab 12, so that the gear 4 is rotatably connected to the whole VR device via the spring 13 and the tab 12. As a result, the gear rack 3 can move based on the occlusion with the gear 4, and thus adjust the distance between the left lens barrel 1 and the right lens barrel 2.

In the embodiments as shown in FIGS. 1, 2, 3, 4 and 5, the position detection device of a VR device further comprises a long sliding bar 7, a first sliding bar 8 and a second sliding bar 9. The long sliding bar 7 comprises a left sliding segment 71 and a right sliding segment 72 which are able to move relative to each other, as a consequence, the length of the long sliding bar vary when the left sliding segment 71 and the right sliding segment 72 move relative to each other. The upper parts of the left lens barrel 1 and the right lens barrel 2 are fixed to the left sliding segment 71 and the right sliding segment 72, respectively. Further, a bottom part of the left lens barrel 1 is connected to the first sliding bar 8. A bottom part of the right lens barrel 2 is connected to the second sliding bar 9. The gear rack 3 comprises an upper gear rack 31 and a lower gear rack 32. The upper gear rack 31 is fixed to the left sliding segment 71 or the right sliding segment 72, and the lower gear rack 32 is fixed to a lens barrel holder in an opposite direction of the upper gear rack 31. The lens barrel holder comprises a left lens barrel holder 10 and a right lens barrel holder 11. The left lens barrel holder 10 is configured to support the left lens barrel 1, and the right lens barrel holder 11 is configured to support the right lens barrel 2. For example, if the upper gear rack 31 is fixed on the left sliding segment 71, the lower gear rack 32 is fixed on the right lens barrel holder 11 of the right lens barrel 2. If the upper gear rack 31 is fixed on the right sliding segment 72, the lower gear rack 32 is fixed on the left lens barrel holder 10 of the left lens barrel 1. As a result, when the gear 4 rotates, the upper gear rack 31 moves the left sliding segment 71 and the right sliding segment 72 of the long sliding bar 7 relative to each other, thus changing the length of the long sliding bar 7 and adjusting the position between the left lens barrel 1 and the right lens barrel 2.

In an embodiment as shown in FIGS. 1, 2, 3, 4 and 5, a magnet 5 is fixed at a preset position. The magnet 5 is set based on a relative position relationship between the gear rack 3 and the gear 4, i.e., the position of the magnet 5 reflects the relative position variation of the gear rack 3 and the gear 4. A Hall sensor 6 is set next to the magnet 5, and the Hall sensor 6 is configured to detect a magnetic induction intensity of the magnet 5.

In the embodiments as shown in FIGS. 1, 2, 3, 4, 5 and 6, the preset position is a position on the lens barrel holder, that is, the magnet 5 is set on the lens barrel holder, either the left lens barrel holder 10 or the right lens barrel holder 11. The magnet 5 moves with the adjustment of the position of the left lens barrel 1 or the right lens barrel 2. A notch mark is provided at one end of the magnet 5. In the exemplary embodiments, the magnet 5 is a 5.8 mm*2 mm*2 mm magnet, which is set on the left lens barrel holder 10, and a small notch of 1 mm*0.8 mm*2 mm is set on the N pole of the magnet 5 to prevent the magnet 5 from being installed backwards. The Hall sensor 6 is fixedly set, that is, the position of the Hall sensor 6 is fixed and will not move with the movement of the left lens barrel 1 and the right lens barrel 2. In the exemplary embodiments, the Hall sensor 6 is Hall linear sensor, and when the left lens barrel 1 and the right lens barrel 2 are closest, the center of the magnet 5 is aligned with the center of the Hall sensor 6. At this point, the distance between the Hall sensor 6 (e.g., Hall IC) and the magnet 5 is 3 mm. In the position where the distance between the magnet 5 and the Hall sensor 6 (also referred to as linear Hall) is 3 mm, the field strength at different positions of the Hall sensor 6 when the magnet 5 moves left and right can be obtained, with unit of T, where 1 T=10 KGs. In the exemplary embodiments, the Hall sensor 6 is a 2.50 mV/Gs sensor, with an output voltage of 1.65V at the center alignment position 0G. At the position of moving left by 2.79 mm relative to the center alignment position, the field strength is −0.024 T=−240 Gs, and the output voltage is 1.65V+ (−240 Gs)*2.50 mV/Gs=1.05V. At the position of moving right by 2.79 mm position relative to the center alignment position, the field strength is 0.024 T=240 Gs, and the output voltage is 1.65V+ (240 Gs)*2.50 mV/Gs=2.25V. It can be known from the above description that different voltages can be obtained according to the magnetic induction intensity, and a distance between the Hall sensor 6 and the magnet 5 can be detected according to the voltage, so as to deduce the distance between the two lens barrels according to the distance between the Hall sensor 6 and the magnet 5, and the distance between the left lens barrel and the right lens barrel can be determined as a pupil distance between both eyes of the user.

In some other exemplary embodiments, the preset position is on the gear 4, i.e. the magnet 5 is set on the gear 4. Further, the Hall sensor 6 is set directly above the gear 4. In the exemplary embodiments, the Hall sensor 6 is a Hall angle sensor. When the gear 4 turns 40° clockwise, the left lens barrel 1 and the right lens barrel 2 move towards each other by 2.79 mm based on the gear rack 3, and the distance between the left lens barrel and the right lens barrel decreases by 5.58 mm. When the gear 4 turns 40° counter-clockwise, the left lens barrel 1 and the right lens barrel 2 move apart from each other by 2.79 mm based on the gear rack 3, and the distance between the left lens barrel and the right lens barrel increases by 5.58 mm. In the entire process, the Hall angle sensor remains unmoved. The Hall angle sensor can detect the angle between the magnet 5 and the Hall sensor 6 as the gear 4 turns, i.e., the angle of rotation of the gear 4 is detected by the Hall angle sensor, which facilitates the subsequent calculation of the distance between the two lens barrels based on the angle of rotation.

In an embodiment as shown in FIGS. 1, 2, 3, 4 and 5, the Hall sensor 6 is connected to a computing unit (not shown in the figures), which is configured to calculate a distance between the Hall sensor 6 and the magnet 5 according to the magnetic induction intensity, and determine the relative movement data between the gear rack 3 and the gear 4 according to the distance between the Hall sensor 6 and the magnet 5. Furthermore, the position detection device of a VR device further comprises an adapter unit, and a rendering unit connected to the adapter unit. The adapter unit is configured to determine the distance between the left lens barrel and the right lens barrel according to the relative movement data and determine the distance between the left lens barrel and the right lens barrel as a pupil distance between both eyes of a user. The rendering unit is configured to adjust and render image data output from the VR device according to the pupil distance so that the adjusted image is output to achieve the best visual effects.

As described above, in the position detection device of a VR device provided in the embodiments of the present disclosure, a gear rack 3 and a gear 4 are provided between the left lens barrel 1 and the right lens barrel 2, and the gear rack 3 is made to be occluded with the gear 4. A magnet 5 is fixed at a preset position based on a relative position relationship between the gear rack 3 and the gear 4. A Hall sensor 6 is provided next to the magnet 5, and a distance between the Hall sensor 6 and the magnet 5 is calculated according to the magnetic induction intensity. Relative movement data between the gear rack 3 and the gear 4 is determined according to the distance between the Hall sensor 6 and the magnet 5, and then the distance between the left lens barrel 1 and the right lens barrel 2 is determined according to the relative movement data, thereby determining the pupil distance of the user, so that targeted image can be output based on the pupil distance to improve the visual effects and enable the user to have a better immersion experience.

As shown in FIG. 7, the embodiments of the present disclosure also provide a position detection method of a VR device, wherein the method is performed by a position detection device of a VR device as previously described. The position detection method of a VR device comprises the following operations S110 to S140.

At S110, a magnetic induction intensity of the magnet is detected by means of a Hall sensor.

At S120, a distance between the Hall sensor and the magnet is calculated according to the magnetic induction intensity.

At S130, relative movement data between the gear rack and the gear is determined based on the distance between the Hall sensor and the magnet.

At S140, A distance between the left lens barrel and the right lens barrel is determined according to the relative movement data, and the distance between the left lens barrel and the right lens barrel is determined as a pupil distance between both eyes of a user.

As can be seen by the above implementation, according to the position detection method of a VR device provided in the embodiments of the present disclosure, a magnetic induction intensity of the magnet is detected by means of a Hall sensor, a distance between the Hall sensor and the magnet is calculated according to the magnetic induction intensity, relative movement data between the gear rack and the gear is determined based on the distance between the Hall sensor and the magnet, and then a distance between the left lens barrel and the right lens barrel is determined according to the relative movement data, and the distance between the left lens barrel and the right lens barrel is determined as a pupil distance between both eyes of a user, so that targeted image can be output based on the pupil distance to improve the visual effects and enable the user to have a better immersion experience.

The position detection device and method of a VR device provided in the embodiments of the present disclosure is described by way of example with reference to the accompanying drawings. However, it should be understood by the person having ordinary skill in the art that various improvements can be made to the above position detection device and method of a VR device proposed in the embodiments of the present disclosure without departing from the content of the present disclosure. Therefore, the scope of protection of the present disclosure should be determined by the content of the attached claims.

Embodiments of the present disclosure further provide a computer-readable storage medium, wherein a computer program is stored in the computer-readable storage medium, and the computer program is configured to perform the operations in the embodiments of the method described above when run.

In some exemplary embodiments, the above computer-readable storage media may include, without limitation to, USB flash drives, Read-Only Memory (ROM), Random Access Memory (RAM), removable hard drives, disks or CD-ROMs, and various other media that can store computer programs.

Embodiments of the present disclosure also provide an electronic device comprising a memory and a processor, having a computer program stored in the memory. The processor is configured to run the computer program to perform the operations in the embodiments of the method described above.

In some exemplary embodiments, the above electronic device may further comprise a transmission device and an input-output device, wherein the transmission device is connected to the above processor and the input-output device is connected to the above processor.

Specific examples in the embodiments may be made with reference to the examples described in the above embodiments and exemplary implementations. This embodiment will not be repeated herein.

Apparently, it should be understood by the person having ordinary skill in the art that the modules or operations of the present disclosure described above may be implemented with a generic computing device. They may be centralized on a single computing device, or distributed on a network of multiple computing devices. Or, they may be implemented with program code executable by the computing device. Therefore, they may be stored in a storage device to be executed by the computing device. In some cases, the operations shown or described may be executed in a different order than herein, or they may be implemented separately as individual integrated circuit modules, or multiple modules or operations thereof may be implemented as individual integrated circuit modules. In this way, the present disclosure is not limited to any particular combination of hardware and software.

The foregoing is only exemplary embodiments of the present disclosure, and is not set to limit the present disclosure, which may have various changes and variations for the person having ordinary skill in the art. Any modification, equivalent replacement, improvement, etc. made within the principles of the present disclosure should be included within the scope of protection of the present disclosure.

INDUSTRIAL APPLICABILITY

As described above, the embodiments of the present disclosure provide a position detection device of a VR device, the distance between the left lens barrel and the right lens barrel can be determined according to the relative movement data, thereby determining the pupil distance of the user, so that targeted image can be output based on the pupil distance to improve the visual effects and enable the user to have a better immersion experience.

What is claimed is:

1. A position detection device of a Virtual Reality (VR) device, the position detection device comprising a left lens barrel and a right lens barrel, wherein
    a gear rack and a gear are provided between the left lens barrel and the right lens barrel, wherein the gear rack is occluded with the gear;
    a magnet is arranged at a preset position which is determined based on a relative position relationship between the gear rack and the gear;
    a Hall sensor is provided next to the magnet, wherein the Hall sensor is configured to detect a magnetic induction intensity of the magnet, the Hall sensor is fixedly set, and when the left lens barrel is closest to the right lens barrel, a center of the magnet is aligned with a center of the Hall sensor;
    the Hall sensor is connected to a computing unit, and the computing unit is configured to calculate a distance between the Hall sensor and the magnet according to the magnetic induction intensity, and determine a distance between the left lens barrel and the right lens barrel according to the distance between the Hall sensor and the magnet; and
    wherein the preset position is on the gear, the Hall sensor is set directly above the gear, and the Hall sensor is a Hall angle sensor, wherein an angle of rotation of the gear is detected by the Hall angle sensor, and the distance between the left lens barrel and the right lens barrel is calculated based on the angle of rotation.

2. The position detection device of a VR device according to claim 1, further comprising a long sliding bar, a first sliding bar and a second sliding bar, wherein
    the long sliding bar comprises a left sliding segment and a right sliding segment which are able to move relative to each other;
    upper parts of the left lens barrel and the right lens barrel are fixed at the left sliding segment and the right sliding segment, respectively;
    a bottom part of the left lens barrel is connected to the first sliding bar; and
    a bottom part of the right lens barrel is connected to the second sliding bar.

3. The position detection device of a VR device according to claim 2, wherein
    the gear rack comprises an upper gear rack and a lower gear rack, wherein the upper gear rack is fixed to the left sliding segment or the right sliding segment;

the lower gear rack is fixed to a lens barrel holder in an opposite direction to the upper gear rack.

4. The position detection device of a VR device according to claim 3, wherein the lens barrel holder comprises a left lens barrel holder and a right lens barrel holder, wherein the left lens barrel holder is configured to support the left lens barrel and the right lens barrel holder is configured to support the right lens barrel.

5. The position detection device of a VR device according to claim 3, further comprising an adapter unit, and a rendering unit connected to the adapter unit, wherein the adapter unit is configured to determine the distance between the left lens barrel and the right lens barrel according to the relative movement data, and determine the distance between the left lens barrel and the right lens barrel as a pupil distance between both eyes of a user; and the rendering unit is configured to adjust and render image data output from the VR device according to the pupil distance.

6. The position detection device of a VR device according to claim 1, wherein a notch mark is provided at one end of the magnet.

7. A position detection method of a Virtual Reality (VR) device, wherein the method is performed by a position detection device of a VR device according to claim 1, and the method comprises:

detecting, by means of a Hall sensor, a magnetic induction intensity of the magnet;

calculating a distance between the Hall sensor and the magnet according to the magnetic induction intensity;

determining relative movement data between the gear rack and the gear based on the distance between the Hall sensor and the magnet; and determining a distance between the left lens barrel and the right lens barrel according to the relative movement data, and determining the distance between the left lens barrel and the right lens barrel as a pupil distance between both eyes of a user.

8. A non-transitory computer-readable storage medium, wherein a computer program is stored in the computer-readable storage medium, and the computer program, when executed by a processor, implements the method according to claim 7.

9. An electronic device, comprising a memory and a processor, wherein the memory is configured to store a computer program, and the processor is configured to run the computer program to perform the method according to claim 7.

10. The position detection device of a VR device according to claim 1, further comprising:

a tab, which is provided on a back side of the gear and used as a base of the gear.

11. The position detection device of a VR device according to claim 10, further comprising:

a spring, which is attached to a back side of the tab, wherein the gear is rotatably connected to the VR device via the spring and the tab.

* * * * *